United States Patent
Dinnan et al.

(10) Patent No.: US 6,178,316 B1
(45) Date of Patent: Jan. 23, 2001

(54) RADIO FREQUENCY MODULATION EMPLOYING A PERIODIC TRANSFORMATION SYSTEM

(75) Inventors: Joseph A. Dinnan, Lilburn; James A. Dinnan, Athens, both of GA (US)

(73) Assignee: Meta-C Corporation, Athens, GA (US)

( * ) Notice: Under 35 U.S.C. 154(b), the term of this patent shall be extended for 0 days.

(21) Appl. No.: 08/848,636

(22) Filed: Apr. 29, 1997

(51) Int. Cl.⁷ ................................................... H04Q 7/02
(52) U.S. Cl. ........................ 455/296; 455/63; 455/114; 375/344; 375/346
(58) Field of Search ...................... 455/218, 220, 455/222, 130, 110, 113, 114, 296, 313, 570, 276.1, 337, 303, 63, 67.3; 375/355, 285, 296, 346, 206, 216, 322, 344, 326, 371, 375; 330/52, 151, 149; 329/104, 300

(56) References Cited

U.S. PATENT DOCUMENTS

| | | | |
|---|---|---|---|
| 3,989,897 | 11/1976 | Carver | 179/1 P |
| 4,560,945 * | 12/1985 | Olver | 455/303 |
| 4,599,732 * | 7/1986 | LeFever | 117/84 |
| 4,737,728 * | 4/1988 | Nakamura et al. | 329/304 |
| 4,860,624 | 8/1989 | Dinnan et al. | 84/1.01 |
| 5,060,310 * | 10/1991 | Frisch et al. | 359/188 |
| 5,306,865 | 4/1994 | Dinnan et al. | 84/622 |
| 5,369,670 * | 11/1994 | Zagloul et al. | 375/370 |
| 5,396,521 * | 3/1995 | Minami | 375/317 |
| 5,418,818 * | 5/1995 | Marchetto et al. | 375/264 |
| 5,438,591 * | 8/1995 | Oie et al. | 329/306 |
| 5,483,203 | 1/1996 | Rottinghaus | 331/10 |
| 5,502,749 * | 3/1996 | Ozaki | 375/368 |
| 5,568,507 * | 10/1996 | Hershey et al. | 375/200 |
| 5,612,975 * | 3/1997 | Becker et al. | 329/308 |
| 5,619,537 * | 4/1997 | Altes | 375/322 |
| 5,663,691 * | 9/1997 | Kowalik et al. | 375/296 |
| 5,706,314 * | 1/1998 | Davis et al. | 375/355 |
| 5,708,683 * | 1/1998 | Kim | 375/355 |
| 5,751,198 * | 5/1998 | Yoshida et al. | 455/110 |
| 5,774,018 * | 6/1998 | Gianfortune et al. | 330/52 |
| 5,778,032 * | 7/1998 | Tanaka et al. | 375/355 |
| 5,784,414 * | 7/1998 | Bruekers et al. | 375/346 |
| 5,790,603 * | 8/1998 | Maeda et al. | 375/355 |
| 5,826,174 * | 10/1998 | Vu | 455/42 |
| 5,832,027 * | 11/1998 | Ishigaki | 375/206 |
| 5,848,105 * | 12/1998 | Gardner et al. | 375/346 |
| 6,003,000 * | 12/1999 | Ozzimo et al. | 704/219 |

OTHER PUBLICATIONS

Kizer, George M., Microwave Communication, Iowa State University Press, Ames, Iowa, 1990, pp. 51–56, 59.

Marcus, Abraham and William Marcus, Elements of Radio, 2nd Edition, Prentice–Hall, New York, 1948, pp. 640–655.

Shrader, Robert L., Electronic Communication, 2nd Edition, McGraw–Hill, New York, 1967, pp. 404–438.

* cited by examiner

Primary Examiner—Dwayne D. Bost
Assistant Examiner—Jean A. Gelin
(74) Attorney, Agent, or Firm—Sughrue, Mion, Zinn, Macpeak & Seas, PLLC

(57) ABSTRACT

An electronic device for improving the average deviation of a modulated signal, particularly a radio frequency (RF) modulated signal. A fixed interval scale system known as Tru-Scale, or other periodic frequency matrix data, is applied to the audio frequency component or baseband signal and increases the strength of the signal. This increase in turn produces an improved modulation model for transmission. In addition, impedance in the baseband signal is reduced, requiring less power to modulate the carrier signal. The process increases periodicity within the baseband signal, improving the Signal to Noise ratio and other measurable performance characteristics. By utilizing signal energy more effectively, more powerful propagational efficiencies result.

17 Claims, 6 Drawing Sheets

Analog to Digital Interface

Analog to Digital Interface

Digital TI Phone Interface from Dsp and Pair 1 and 2 input

Tru-Scale Technology Demonstration Platform Hardware 305,356,452

RADIO FREQUENCY MODULATION EMPLOYING A PERIODIC TRANSFORMATION SYSTEM

BACKGROUND OF THE INVENTION

The present invention relates to a new technique used to improve baseband periodicity, resulting in improved modulation. The disclosed techniques can be used to enhance all forms of radio transmission and reception. In a radio receiver, the audio output depends entirely on the amount of variation in the carrier wave, not upon the strength of the carrier alone.

Carver (U.S. Pat. No. 3,989,897) teaches:

In real time with the incoming signal, a circuit receives and monitors the content of the incoming audio signal and measures or estimates the degree of correlation of the content of such signal. As used herein, the term degree of correlation refers to the degree of periodicity, as contrasted with randomness, of the signal content. Those signals which exhibit a relatively high degree of periodicity are signals which are predictable and are thus considered to have high degree of correlation. On the other hand signal content which is random, that is nonperiodic, is considered to have low degree of correlation. Pure sinusoidal musical sounds are highly correlated while noise is completely random and thus uncorrelated.

Rottinghaus (U.S. Pat. No. 5,483,202) notes:

In frequency modulated "FM systems", the occupied bandwidth of the transmitter is a function of both modulating signal bandwidth (or symbol rate in digital FM) and the deviation. The deviation is typically a difficult to control parameter leading to one of several compromise situations. The first compromise situation is the use of precision components to decrease the variability of the deviation. Such precision components are rather expensive which leads to a rather substantial increase in the overall cost of the transmitting device. The second compromise situation is the use of labor intensive factory tuning. The factory tuning of a transmitting unit decreases the variability of the deviation but also adds to the cost as well as decreasing product reliability. Yet a third compromise situation is to use neither precision components nor factory tuning. In this third situation, the deviation tolerance is poor, meaning that the unit with the worst case maximum deviation must have an occupied bandwidth that is still within the assigned bandwidth. In this third situation, the average device has a deviation, and corresponding occupied bandwidth which is dramatically underutilized.

The largest permissible variation in the carrier wave therefore produces a stronger signal. Modulation percentage is a measurement of this variation. One Hundred Percent (100%) modulation is the condition in which the carrier amplitude during modulation at times is zero and at other times is increased to twice its unmodulated value. This phenomenon occurs when the peak amplitude of the audio frequency current equals the amplitude of the audio frequency unmodulated carrier.

The proportion between the amplitude of the audio frequency current and amplitude of the carrier is called the degree of modulation and can be measured in percentages. For example, if the peak amplitude of the audio frequency signal is equal to three fourths the amplitude of the carrier signal, there is seventy five percent (75%) modulation. Clearly, by treating the audio frequency current, the degree of modulation can be increased. There are a number of processes cited in the prior art that attempt to increase modulation. These attempts all fit in one of several broad categories. These can be outlined as follows, Compression, Excitation or Equalization.

The Compression method results in a compressed signal which improves modulation at specific frequencies at the expense of faithful reproduction of all other frequencies, as well as a reproduced sound that has a substantially altered status. While a compressed signal can increase average deviation power, it is accomplished at a heavy price due to the altered condition of the information content transferred in the modulation process.

Excitation is the method of interjecting additional power into one specific harmonic component of the waveform. This method exaggerates the desired harmonic structure and amplifies the frequency components associated with the spectral excitation. As in compression, the resultant unmodulated signal's information content has been altered. The use of excitation can also increase average deviation voltage. However, as with compression, there is an undesirable effect on the spectral content of the signal.

Equalization is a method of adding power to or subtracting power from large frequency bands within the signal. Where excitation only adds power to a specific frequency within the frequency band, equalization acts on a large discrete set of frequencies. By adding or subtracting power to the desired frequency band, alterations to the frequency envelope will affect information content as well as average deviation. As with the above methods, dramatic alterations to information content, as well as signal envelope shaping, result. These alterations, while allowing increases in the average deviation model, can and often do distort information content in an undesirable fashion.

By realigning the baseband spectral content in a unique way, and making it more periodic, there is less impedance in the baseband signal. This reduction in impedance translates into an increase in the frequency/power density of the spectral model, as will be seen in the following discussion and drawings. With a higher density in the spectral content of the waveform, the average deviation voltage is higher. As a result, modulation is more consistent, thus allowing greater propagation without the undesirable effects of spectral envelope shaping created by all other previous methods.

By aliening spectral content in a unique way, the present invention creates beatless cycles or relationships. This in turn affects the energy dispersal within the signal. The invention allows a greater amount of energy to be distributed among all spectral components. As a result of the baseband signal's greater spectral density, modulation becomes more consistent. This increase in spectral density also increases the average deviation voltage, therefore increasing the average modulation power.

The effect of the present invention on one type of transmission, namely Frequency Modulation (FM), now will be discussed. The greater the RMS and Peak Amplitude of the baseband signal, the greater the frequency variation, or deviation, of an FM modulated carrier. In typical broadcast FM applications, 15 kHz is the highest required audio frequency to be transmitted, and 75 kHz is the largest frequency deviation allowed. The ratio of the maximum allowable deviation to the highest modulating frequency is therefore 75:15. This is known as the deviation ratio. The ratio of the maximum allowable deviation to a specific modulating frequency is called the modulation index. It should be noted that the modulation index and the deviation ratio are the same only at the maximum frequency deviation with the maximum modulating frequency signal.

The deviation ratio of 5 that is used in standard FM broadcasting will produce eight significant sidebands above and below the center frequency with a 15 kHz modulating tone. (The number of sidebands is determined by Bessel functions.) Such a modulating signal will produce sidebands 120 kHz off each side of the modulating center frequency, and will require a total bandwidth of 240 kHz. Since the fundamental frequency of all musical instruments as well as the human voice is below 5 kHz, it is unlikely that a strong signal will ever be transmitted at as high an audio frequency as 15 kHz. When a 5 kHz tone is transmitted, its modulation index is 75/5 or 15. A modulation index of 15 has 20 significant sidebands and will require the following bandwidth:

$$2(+,-) \times 5(dev\ Ratio) \times 20(Sidebands) = 200\ kHz,$$

provided the carrier is deviated a full 75 kHz by a 5 kHz tone. While 5 kHz is a relatively high frequency in the audio spectrum, it is occasionally applied to the transmitter with enough amplitude to produce full deviation. However, on average, in standard voice or music broadcast, most frequencies above 5 kHz are unable to produce full deviation. As a result, there is unused modulation potential in the average baseband program signal. The present invention utilizes this potential by realigning spectral content into a more periodic signal allowing improved average deviation and greater power efficiency.

Clearly there is a direct correlation between audio spectral content and modulation. Any improvement to the overall spectral density or other improvements to the baseband signal such as Signal to Noise Ratio, will implant those same improved characteristics onto the unmodulated carrier in the form of improved Carrier to Noise Ratios or other measurable improvements. These improvements to the baseband signal enhance the performance of the modulated carrier signal. Accordingly, by utilizing the present invention in the broadcast chain, the average modulation efficiency is improved. While these data refer to baseband alternating current signals, the principles supported by the current invention can be applied to any other spectral content.

SUMMARY OF THE INVENTION

In accordance with the present invention, there is provided a signal processing technique that makes complex signals such as voice and music more periodic, thus increasing spectral density and improving signal performance. By employing a series of frequencies using specific patented ratios (described as the Tru-Scale interval system), or any other periodic frequency relationship matrix, the spectral content of the treated signal is free of intermodulation distortion. Noise in the signal, represented as intermodulation distortion, harmonic distortion or overtone collision, is reduced. With less interference, the baseband signal power is increased before it is placed on the unmodulated carrier, this in turn increases the average modulation percentage.

By creating beatless cycles or relationships, the present invention allows energy dispersal within the signal to be more efficient. A greater amount of relative energy is distributed among all spectral components. As a result, the baseband signal displays greater spectral density, causing modulation to become more consistent. This increase in spectral content also increases the average deviation voltage, therefore increasing the average modulation power of the signal. In addition, the present invention improves the demodulated baseband signal by reducing the amount of intermodulation distortion and harmonic distortion (overtone collision) from the baseband signal prior to modulation, thus improving all measurable quality characteristics of the demodulated signal throughout the demodulation and reproduction process.

DETAILED DESCRIPTION OF A PREFERRED EMBODIMENT

Figure 1:
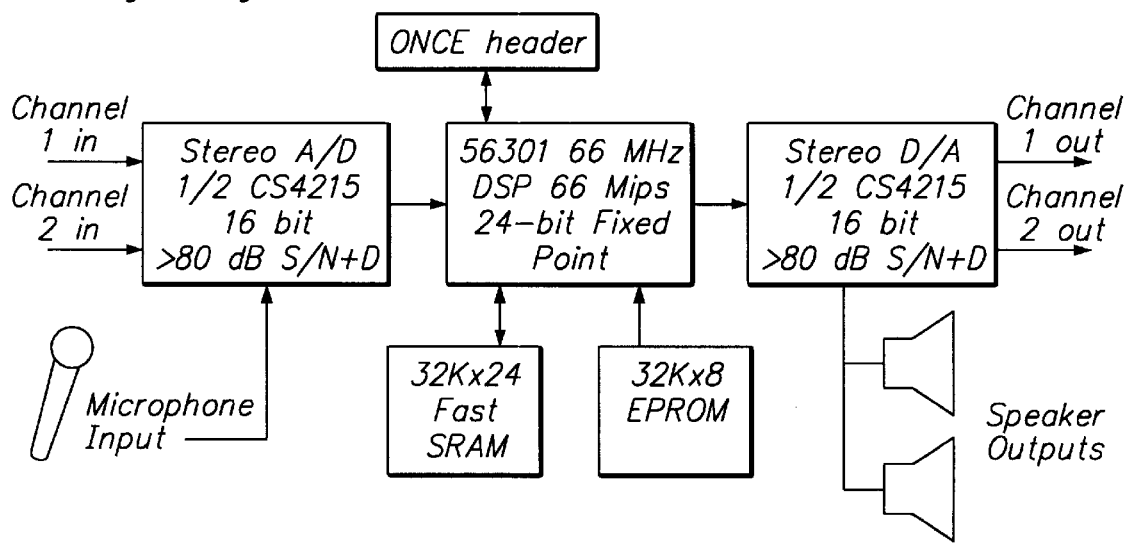
FIG. 1 is a block diagram of an analog-to-digital processor according to the invention.

FIG. 1 in the application shows an Analog to Digital Interface used in implementing the invention. Input signals come from the left, into A/D converter 110, which converts the input analog signals to 16-bit digital signals. In the preferred embodiment, the A/D converter 110 is one portion of a Crystal Semiconductor CS4215 16 bit Stereo digital-to-analog and analog-to-digital converter. The part is a CD quality oversampling converter. Because it oversamples, and has internal digital filters, minimal order smoothing and anti-aliasing filters are required. The component has variable input gain and output attenuation circuitry built in. This allows DSP 120 to adjust the input and output gain based upon input provided via a dipswitch.

DSP 120 receives the digital signals from A/D converter 110, and also receives inputs from SRAM 130 and EPROM 140. The system boots from EPROM 140, and runs from SRAM 130. EPROM 140 will have the Tru-Scale frequency interval system stored in it. The DSP 120 will perform the necessary frequency counting, phase estimation, frequency shifting, and phase manipulation, as will be discussed in greater detail below. Most of these functions are well known, and so need not be described in detail here, but in the context of the present invention, they have added to them the frequency shift function specific to the Tru-Scale interval system. It is this frequency shift, operating on the baseband portion of the input signal, that plays such a significant role in reducing distortion—not only intermodulation distortion, but also harmonic distortion.

The output of the DSP 120 passes to D/A converter 150, which in the preferred embodiment is the other portion of a Crystal Semiconductor CS4215 16-bit D/A converter, though of course other D/A converters may be used.

Figure 2:
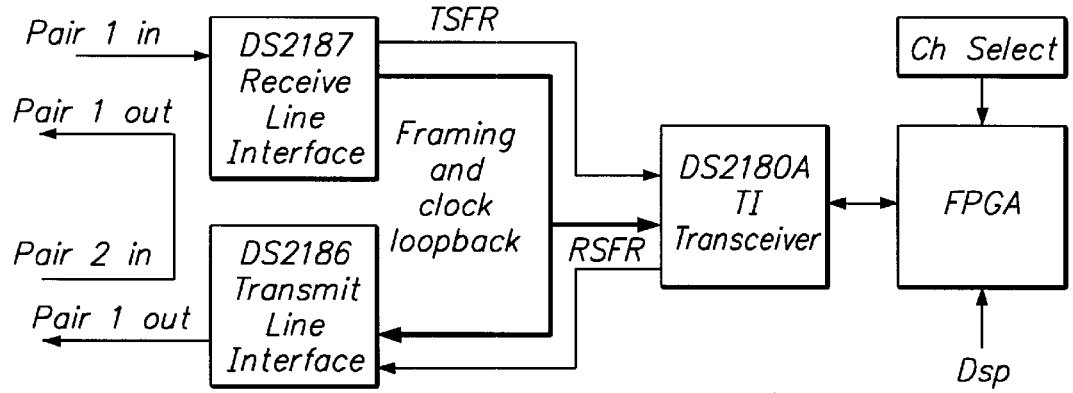
FIG. 2 is a block diagram of a T1 processor for telecommunication according to the invention.

Looking now at FIG. 2, a T1 interface for purposes of the invention includes a receive line interface 210 (in the preferred embodiment, a Dallas Semiconductor DS2187); a transmit line interface 220 (in the preferred embodiment, a DS2186), a T1 transceiver 230 (in the preferred embodiment, a DS2180A), and an FPGA 300 are connected as shown. The T1 interface allows a Tru-Scale Technology Demonstration Platform (TTDP, shown in FIG. 3) to be inserted into a T1 data stream. The interface processes a subset of the channels in one direction and simply loops the other direction through. This circuitry could be duplicated if full duplex processing is desired. The receiver line interface 210, the transmitter line interface 220, and the T1 transceiver 230 together provide complete support of all framing, signaling, and data representation standards used currently on primary rate (1.544 MHz) T-carrier transmission systems. The T1 transceiver 230 provides all data, signaling, and framing information to FPGA 300. The FPGA 300 loops everything directly back to the T1 transceiver 230 except for the channels it desires to process. The unprocessed channel data is sent to a digital signal processor such as DSP 120 in FIG. 1, while the processed data is received from the DSP and inserted into the appropriate channel slot. Selection circuitry 240 is provided to allow the desired channels to be selected for processing.

A 56301 DSP is referenced in FIG. 1. The invention also contemplates use of other DSPs, such as the Motorola 56002. The DSP is the processing engine which implements the Tru-Scale algorithm. It receives samples from all the interfaces, performs Tru-Scale processing, and returns processed samples to the appropriate interface. Samples arrive from the T1 interface at a sample rate of 8 KHz. Samples arrive from the analog interface at a sample rate which varies from 4 to 48 KHz. Samples can arrive from the generic digital interface at various rates. By using an off-the-shelf general purpose DSP such as the Motorola 56002, variations of the Tru-Scale algorithm are simply software changes. The 56002 is a highly parallel 24 bit part with three internal data busses. The program will boot from slow EPROM (such as EPROM 140 in FIG. 1)) and run out of high speed static RAM (such as SRAM 130 in FIG. 1).

A generic digital interface provides a synchronous serial interface dedicated for audio transfers. It provides full duplex serial support for serial connection with a wide variety of audio devices such as A/Ds, D/As, CD players, etc. Depending on the configuration of the programmable logic, support can be provided for a variety of data formats such as I$^2$S, I$^2$X, etc.

Figure 3:
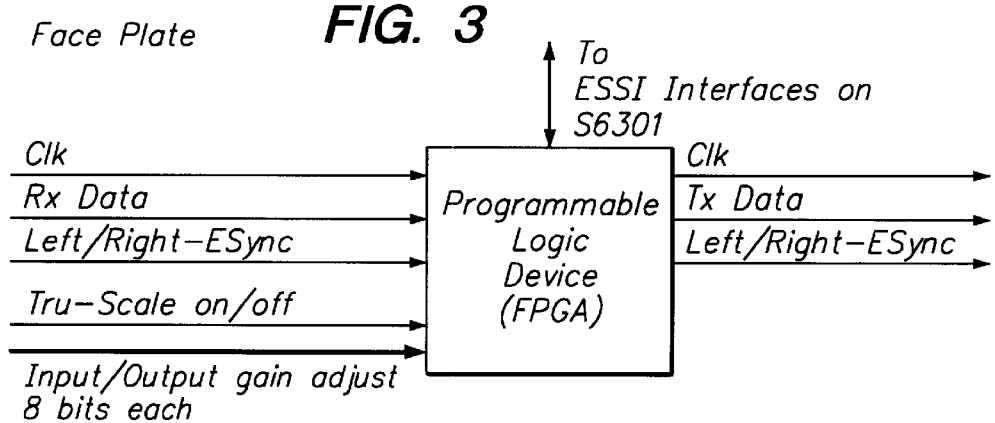
FIG. 3 is a block diagram of the inputs to and outputs from a programmable logic device used in implementing the invention.
Figure 4:
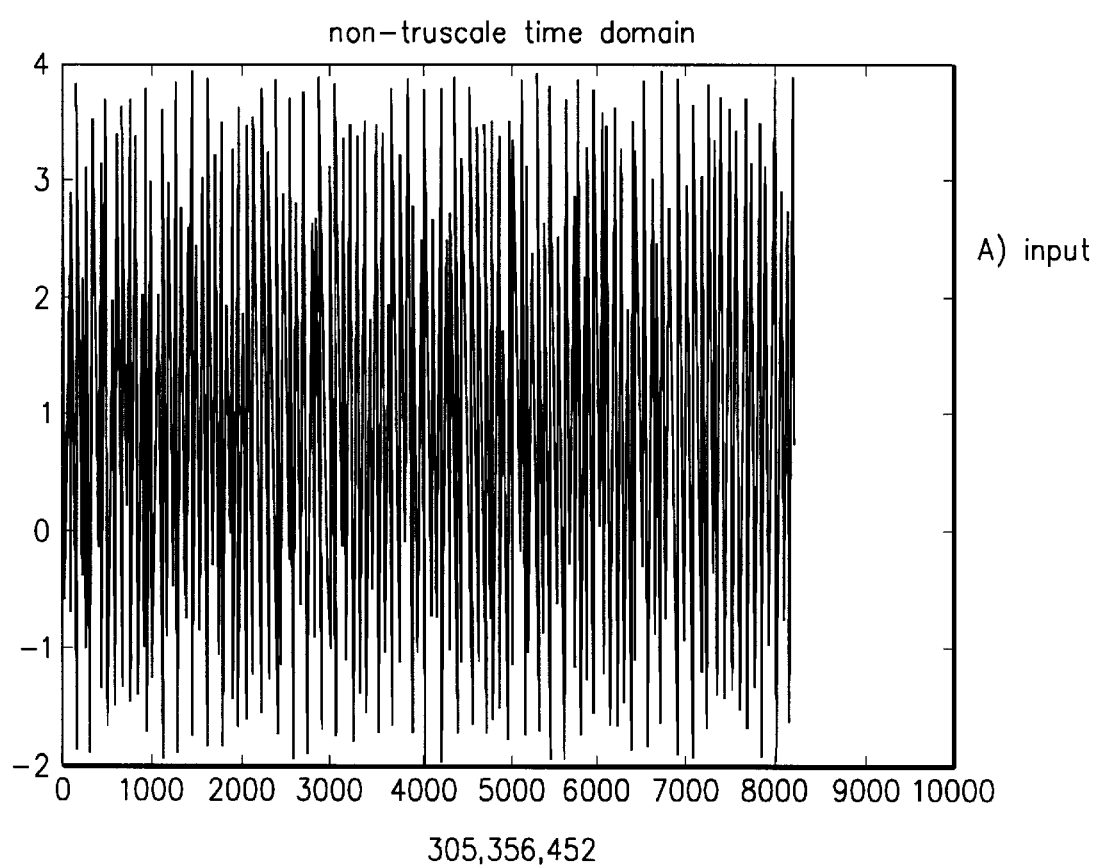
FIG. 4 is a computer simulation of a time domain Graph showing a non-Tru-Scale (unprocessed) complex signal.
Figure 5:
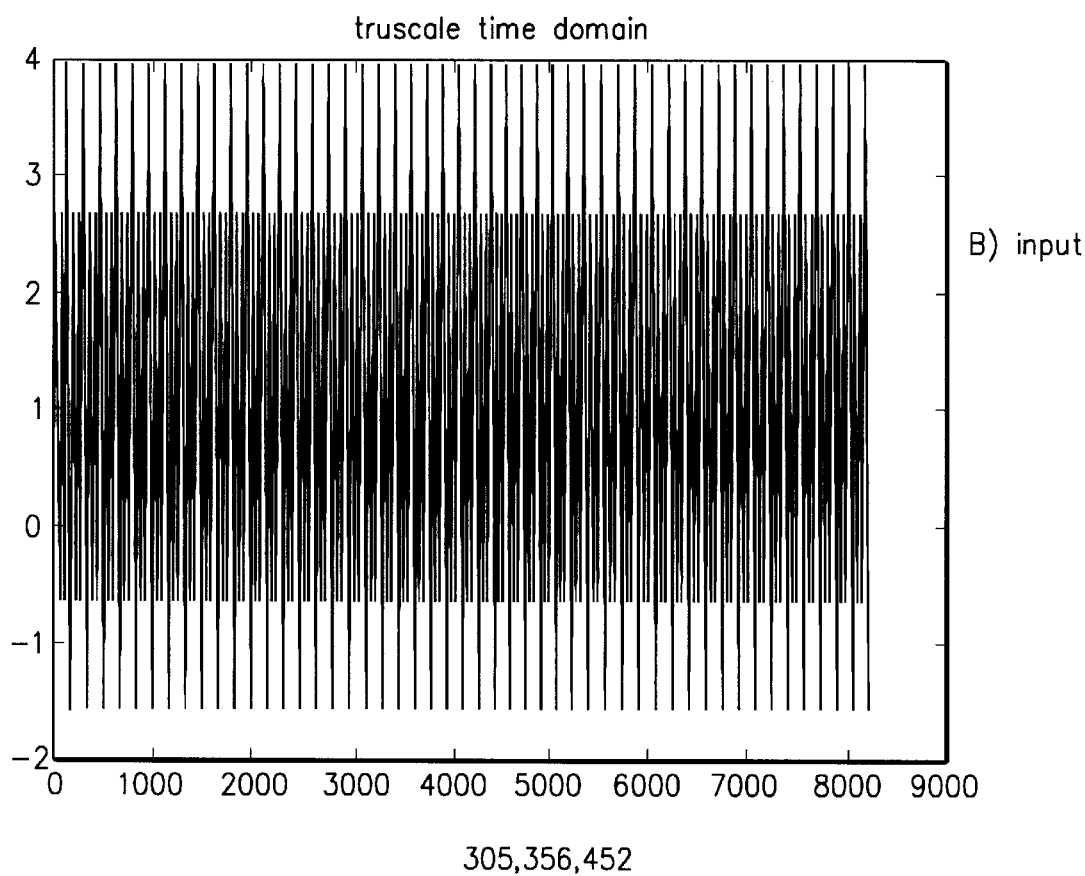
FIG. 5 is a computer simulation of the above complex signal after being processed by the Tru-Scale (periodic) matrix.

The Tru-Scale Technology Demonstration Platform (TTDP), shown representatively in part in FIG. 3, allows the Tru-Scale algorithm to be integrated into a variety of applications in order to demonstrate the power of the technology. Interfaces include: T1 (24 channels), two channel analog, and generic digital. The T1 interface allows the TTDP to interface seamlessly into a T1 link while providing Tru-Scale processing on a subset of the 24 channels. The two channel analog interface allows the TTDP to provide Tru-Scale processing on high quality full duplex or stereo audio analog signals. A generic digital interface provides the hardware capability to support many different digital audio interface standards.

As shown in FIG. 3, a programmable logic device 300, which may be a field programmable gate array (FPGA), has interface connections as just discussed. A Tru-Scale on/off input enables comparative testing of results with and without Tru-Scale. The FPGA is designed to interface with a standard DS1 channel, remove the formatting and identifying channel bit structure, and allow access to the channelized voice data. The aforementioned process allows the individual voice channel to be accessed for processing at the baseband level. Upon completion of processing, the signal is again sent to the FPGA for rechannelization into the DS1 format.

The principle behind the invention, and its implementation now will be described in detail. Looking first at Ohm's law (V=IxR), if R is replaced in this direct current version of Ohm's law by Z, the equation will apply to alternating currents. Thus, Ohm's law for alternating currents can be written as follows:

$Z=E/I$ impedance=voltage/current

To produce a modulated waveform, a transmitter must expend power. The amount of power required to modulate a transmitter is affected by the relationship between the baseband current and the modulated carrier. To modulate a carrier 100% with a single frequency requires the modulated carrier power to be twice that of the baseband signal power. In addition, the peak amplitude of the modulated carrier current in 100% modulation is twice that of the unmodulated carrier current. The equation to calculate this percentage follows. Since the power can be represented as:

$p(t)=i^2(t) \times R$, and if Resistance R is assumed to be constant (i representing current), the power of the peaks of the modulated carrier is four times ($2^2$) that of the unmodulated carrier. However, this value holds only for the peaks. It has been calculated that during 100% modulation generated by a sine wave, the average power of the modulated carrier is one and one half times that of the unmodulated carrier. Since increase in power must be generated from the modulator, the baseband signal power must be equal to one half the unmodulated carrier power. Thus, 100 percent modulation occurs when the peak amplitude of the audio frequency current equals the amplitude of the audio frequency unmodulated carrier current.

When modulating complex signals such as voice, data and music, the greater portion of the baseband signal components will not modulate the carrier 100 percent. The periodic nature of a sine wave is the basis for all relative modulation percentages. By making a signal more like a sine wave, and therefore more periodic, it is possible to increase modulation efficiency, reduce impedance and increase average deviation voltage, making the transmission much more efficient.

Considering a baseband signal as an alternating current, reduction in impedance is accomplished by reducing the amount of intermodulation distortion (overtone collision) in the complex signal. The percentage of impedance in the signal is related to the degree of phase offset. As an example, two signals of the same frequency one hundred eighty (180°) degrees out of phase will neutralize each other's effective power completely because of destructive interference. To determine the amount of impedance residing in the signal it will be necessary to use the following formula:

$$B \times A = C \times X = D \quad (1)$$

$$X - D = V \quad (2)$$

Where:
A=cancellation constant (0.55 found by 100% out of phase in 180°)

B=phase offset of intermodulation components (in degrees)
C=resultant of phase degree multiplied by A
X=Radius on the unit circle
D=voltage multiplied by C r
V=voltage The relationship between the degree of phase offset relative to zero phase or complete coherence and impedance in the signal can be represented on the unit circle. For each degree of phase intermodulation offset, there is a corresponding increase in the impedance inherent in the signal.

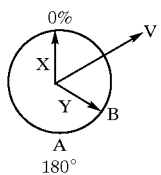

In addition:
X+X=maximum phase coherence
X+Y=Vector V
V=Root Mean Square Voltage value at time T
A=Maximum Cancellation
B=degree of phase offset The current invention can be described as a signal processing technique that transforms complex signals such as voice and music into more periodic signals. By employing a set of frequencies described as the Tru-Scale interval system, or any set of periodic frequency relationships, the spectral content of the treated signal is free of intermodulation distortion. Noise in the signal, represented as intermodulation distortion, harmonic distortion and overtone collision, is reduced accordingly. With less noise, the signal has a more efficient Signal-to-Noise ratio. With less interference, the baseband signal spectral content and power efficiency is increased before it is placed on the unmodulated carrier. This in turn increases the modulation percentage of the modulated carrier.

Because of the performance gain achieved in the modulation process, the present invention improves the demodulated signal performance as well. The following equations outline the baseband signal to demodulation relationship. The noise voltage at baseband frequency $\omega=\omega_n-\omega_c$ measured in the narrow bandwidth f at the output of the modulator will be:

FM demodulator output:

$$n(\omega)_f = K_d s/s t\theta(i)_f = K_d \theta(i)_f$$

Where
n=noise,
θ=phase,
and (i)=signal.

$K_d$ is the demodulator constant related to the demodulator sensitivity s and demodulator output st amplifier gain. Generally, output noise is referenced to a nominal signal voltage g(t). It is assumed that the signal g(t) is an average sine wave that produces a peak frequency deviation of DF. If x(t) is a voltage, g(2)(t) is the normalized power of that voltage. In general $\omega=2\pi f$ with $\omega$ in radians and f in hertz.

It can be assumed that DF≦100%, if g(t)≦100% periodic sine wave.

It can also be observed that noise at the baseband (post detection) frequency w is actually due to noise components at the premodulated baseband frequency $\omega_n+\omega_c$ as well as $\omega_n-\omega_c$. Since all practical baseband measurements imply positive frequencies, the preceding results are doubled, which is valid since the noise phases θ(n) are assumed to be uncorrelated (non-periodic) for different predetection frequencies. The noise power n(2)(t) is just the noise power measured at the baseband frequency w with measurement bandwidth f. This power is equal to the noise power density N(o)(f) (Watts per hertz) of the noise power transfer function H(f) between the noise source and the demodulator.

It has been shown that the present invention substantially reduces noise in a given signal by transferring unperiodic noise energy into periodic signal energy. Therefore, the present invention improves signal performance by injecting signal coherence into the above equation. This is accomplished by correlating all noise phases.

The Signal-to-Noise Ratio can be calculated by:

$$SNR(dB)=10 \log [\text{reference tone power}]/[\text{measured channel noise power}].$$

Therefore, one method of incorporating the present invention is as follows, using an equation which the inventors have termed the Tru-Scale modulation equation:

$$unV \div TSQS = \text{Round}(VV) = TSQV \div TSQV = 1 \times SWL \div Zc = F \times SR \div F^2 = \text{Round}(FV) = TSF = PS$$

Where,
unV=unperiodic noise voltage
TSQS=Tru-Scale quantization step
VV=Resulting voltage value, round to nearest whole quantization step
TSQV=Corresponding Tru-Scale Quantization Value
SWL=Total samples in sample window length
Zc=the frequency input amount of zero crossings in sample window length
F=resulting value from computing SWL/Zc
SR=Sample Rate
FV=Resulting frequency value, round to nearest whole number
TSF=Corresponding Tru-Scale Frequency
PS=Periodic Signal This calculation outlines in one step, how to process an incoming non periodic signal and output a Tru-Scale or other periodic signal. The Tru-Scale quantization step involves the use of the Tru-Scale interval system, as disclosed for example in U.S. Pat. No. 5,306,865, according to the following table:

| Ratio | Frequency (Hz) | Interval (Hz) |
|---|---|---|
| — | — | 6.25 Hz |
| 1:1 | 300 | 12.5 Hz |
| 25:24 | 312.5 | 12.5 Hz |
| 13:12 | 325 | 12.5 Hz |
| 9:8 | 337.5 | 12.5 Hz |
| 7:6 | 350 | 12.5 Hz |
| 29:24 | 362.5 | 12.5 Hz |
| 5:4 | 375 | 12.5 Hz |
| 31:24 | 387.5 | 12.5 Hz |
| 4:3 | 400 | 12.5 Hz |
| 11:8 | 412.5 | 12.5 Hz |
| 17:12 | 425 | 12.5 Hz |
| 35:24 | 437.5 | 12.5 Hz |
| 3:2 | 450 | 12.5 Hz |

-continued

| Ratio | Frequency (Hz) | Interval (Hz) |
|---|---|---|
| 37:24 | 462.5 | 12.5 Hz |
| 19:12 | 475 | 12.5 Hz |
| 13:8 | 487.5 | 12.5 Hz |
| 5:3 | 500 | 12.5 Hz |
| 41:24 | 512.5 | 12.5 Hz |
| 7:4 | 525 | 12.5 Hz |
| 43:24 | 537.5 | 12.5 Hz |
| 11:6 | 550 | 12.5 Hz |
| 15:8 | 562.5 | 12.5 Hz |
| 23:12 | 575 | 12.5 Hz |
| 47:24 | 587.5 | 12.5 Hz |
| 2:1 | 600 | 12.5 Hz |
| — | — | 25 Hz |

While the octave from 300 Hz to 600 Hz has been shown by way of example, the foregoing ratios remain constant regardless of octave. The intervals expand or contract appropriately according to octave (e.g. the interval becomes 6.25 Hz for the octave from 150 Hz to 300 Hz, and becomes 25 Hz for the octave from 600 Hz to 1200 Hz).

Figure 7:
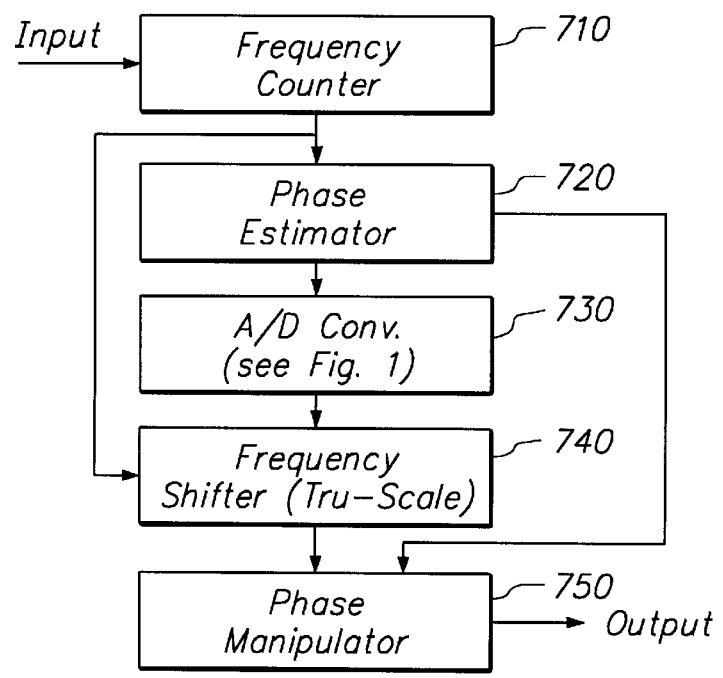
FIG. 7 is a block diagram of an overall implementation of the invention.
Figure 6A:
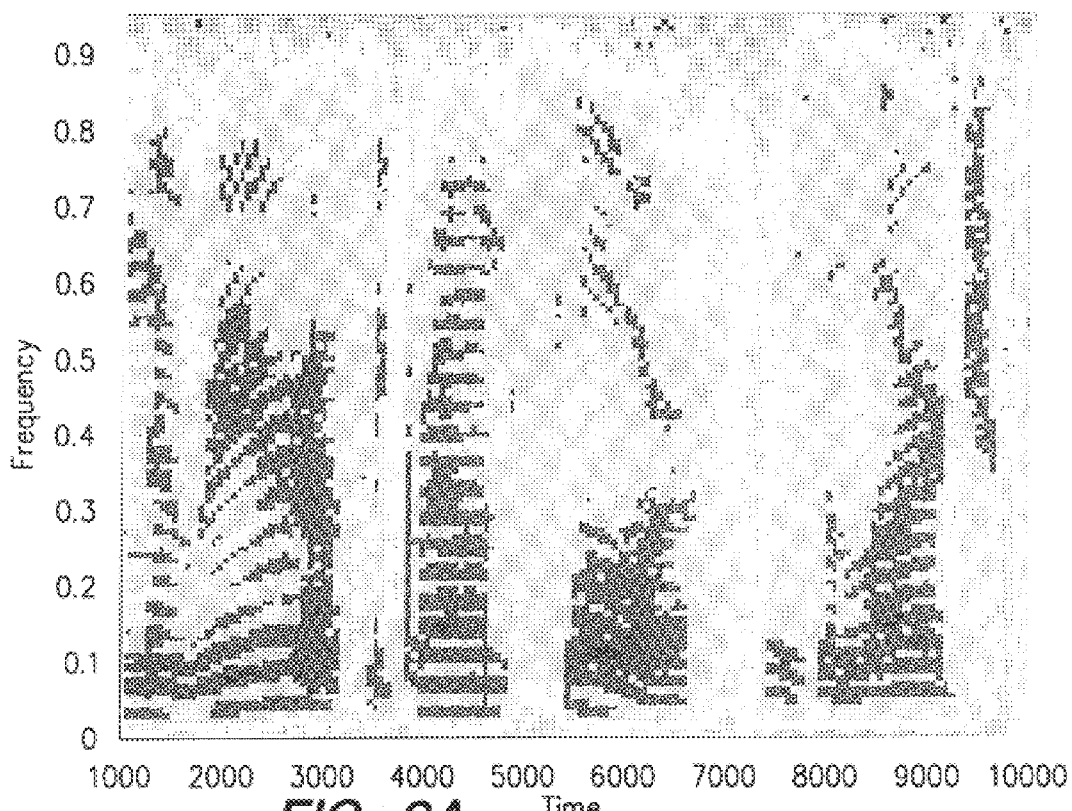
FIG. 6A is a spectral density graph for an unprocessed signal.
Figure 6B:
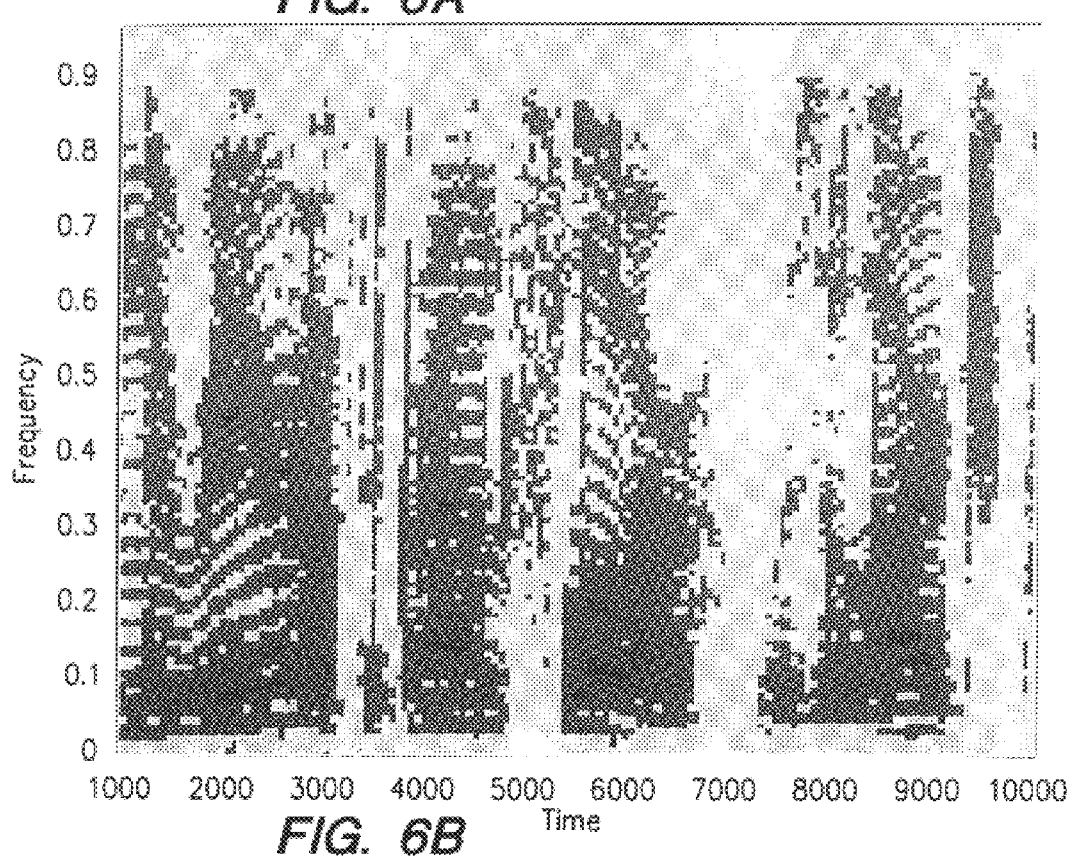
FIG. 6B is a spectral density graph showing the improvement in spectral density of a signal processed with the present invention.

Another way of viewing the invention, as an alternative to the foregoing equation, may be understood with reference to the following sequence of operations, and also with reference to FIG. 7:

1) Input a complex, aperiodic signal, composed of a number of uncorrelated frequencies.

2) Estimate periodicity of the incoming signal using, for example, a frequency counter 710 as in FIG. 7;

3) Estimate dominant phase properties of the input complex signal using, for example, a phase estimator 720 as in FIG. 7;

4) Convert a complex analog signal into discrete steps using an A/D converter 730 as shown in greater detail FIG. 1, the discrete steps being defined by predetermined quantized Tru-Scale values;

5) Use the above frequency counter estimate to shift the digital signal values to predetermined Tru-Scale frequencies, using a frequency shifter 740 as in FIG. 7, the frequency shifter 740 employing for example the table set forth above to map frequencies to Tru-Scale frequencies;

6) Use the phase estimator output to shift the phase to a predetermined phase relationship using, for example, a phase manipulation circuit 750 as in FIG. 7; and 7) Output the resulting signal, which will be more periodic, with improved performance characteristics (i.e. decreased harmonic and intermodulation distortion at baseband).

The inventive process increases the Signal-to-Noise ratio, and also reduces intermodulation distortion. The current invention teaches a method which can produce a more efficient signal for modulation, by which the aforementioned signal quality gain is implanted onto the modulator, increasing the average deviation ratio (DF) by a percentage directly related to the instantaneous improvement in the baseband signal efficiently via a reduction in impedance at a given instant in time (t).
Therefore:

$$DFV = mxCF/mxAF/RMS \text{ of } g(t)$$

Where
DFV=Average deviation voltage ratio
RMS=Root mean square voltage
g(t)=Signal voltage
t=Discrete time
mx CF=Maximum allowable Carrier deviation
mx AF=Maximum audio frequency The above equation shows that for every decrease in average signal voltage g(t), a corresponding decrease will be seen in the average deviation voltage ratio DFV. This will allow the same deviation ratio of a signal to be attained with less power required per average deviation. This increase in efficiency can be used to add proportional strength to the modulated signal via a simple automatic gain control circuit or other means as anticipated by the inventors for use with the current invention. This signal efficiency improvement can also be used to increase data rates producing greater performance in digital systems as well.

Figure 8A:
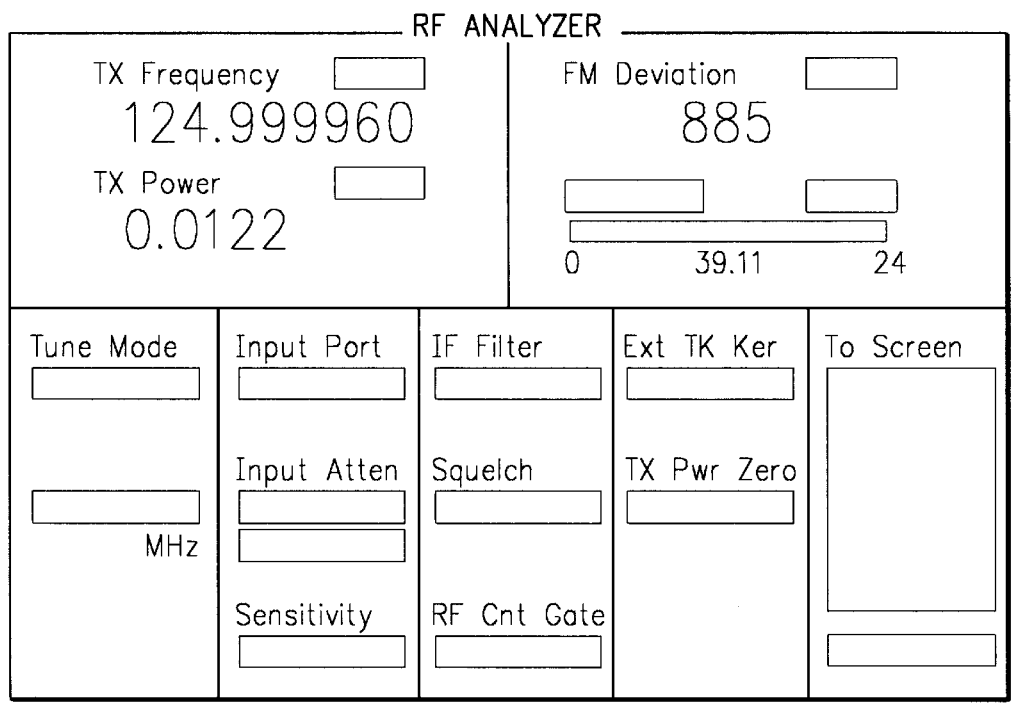
FIGS. 8A and 8B are photographs showing input levels and resulting waveforms for RF modulation without the use of the present invention.
Figure 8B:
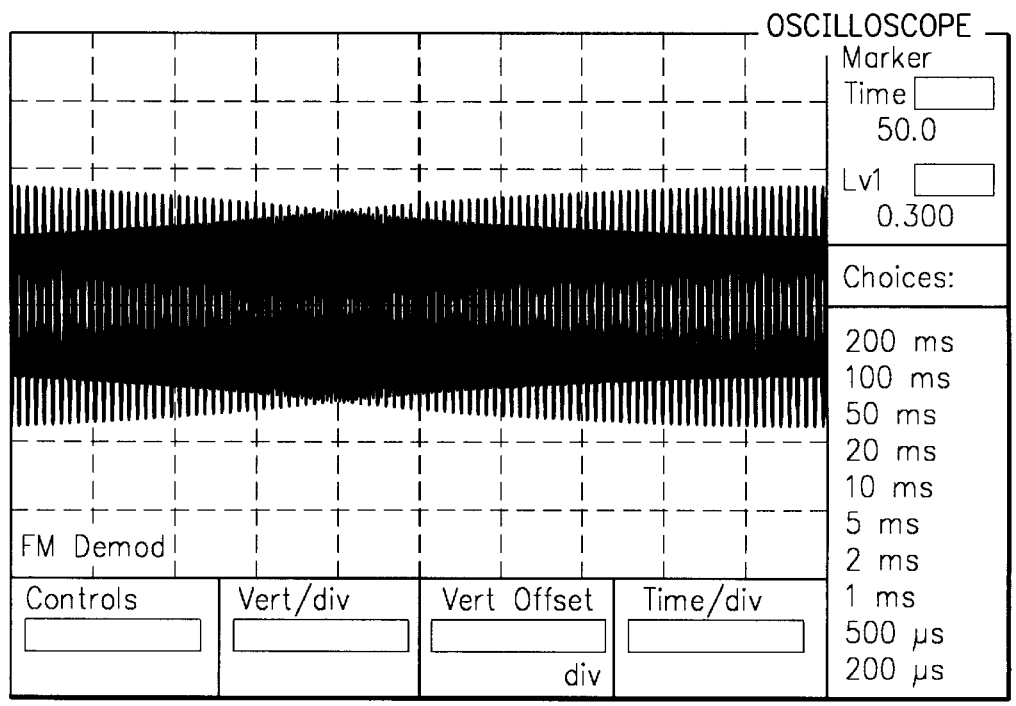
Figure 8C:
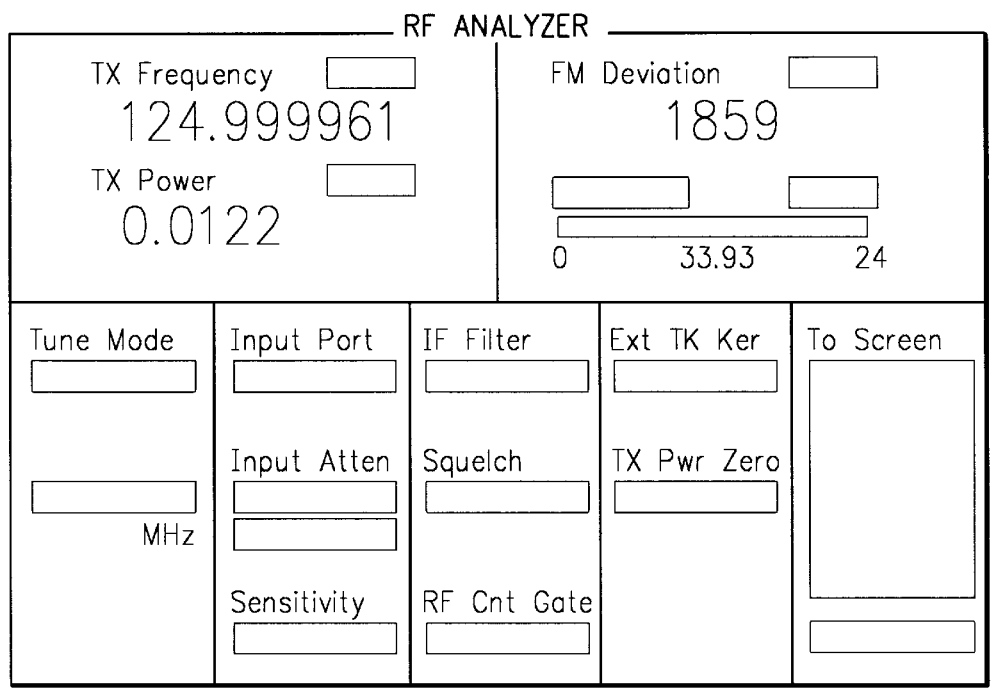
FIGS. 8C and 8D are photographs showing input levels and resulting waveforms for RF modulation using the present invention.
Figure 8D:
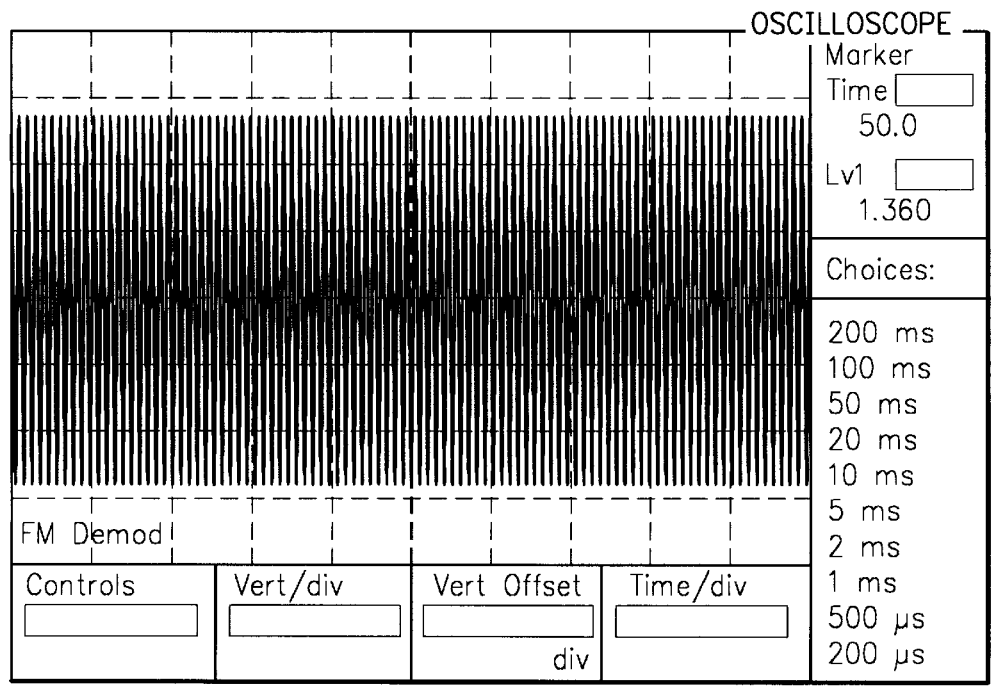

FIGS. 8A–8D show pictorially the effects of the invention. FIG. 8A shows the frequency and power values, and FIG. 8B shows the resulting waveforms. There is destructive interference, also referred to as overtone collision. FIG. 8C shows similar frequency and power values, but the waveforms in FIG. 8D show almost no destructive interference. The difference in FM deviation values shown in FIGS. 8A and 8C, respectively, are an indication of the effects of the invention on reducing distortion in RF modulated signals.

While the invention has been described in detail with reference to a preferred embodiment, various modifications within the scope and spirit of the invention will be apparent to those of working skill in this technological field. Consequently, the scope of the invention is determined by reference to the following claims.

What is claimed is:

1. A method of reducing distortion in a radio frequency (RF) modulated signal, comprising the following steps:
    sampling an input RF signal in accordance with a predetermined frequency interval system to provide signal samples;
    shifting said signal samples in accordance with said predetermined frequency interval system so as to provide improved periodicity of a resulting output signal; and
    outputting said output signal.

2. A method as claimed in claim 1, wherein said sampling and shifting steps operate on a baseband component of said RF signal so as to reduce said distortion.

3. A method as claimed in claim 1, wherein said distortion includes harmonic distortion.

4. A method as claimed in claim 1, wherein said distortion includes intermodulation distortion.

5. A method as claimed in claim 1, further comprising the step, between said shifting and outputting steps, of manipulating a phase of said signal samples to provide a predetermined phase relationship.

6. A method as claimed in claim 5, further comprising the step, between said sampling and shifting steps, of estimating a phase of said input RF signal, said manipulating step being performed in accordance with a result of said phase estimating step.

7. A method as claimed in claim 1, further comprising the step, between said sampling and shifting steps, of estimating a periodicity of said input RF signal, said shifting step being performed in accordance with a result of said periodicity estimating step.

8. A method as claimed in claim 1, wherein said predetermined frequency interval system is Tru-Scale.

9. Apparatus for reducing distortion in a radio frequency (RF) modulated signal, comprising:
    a sampler for sampling an input RF signal in accordance with a predetermined frequency interval system to provide signal samples;

a frequency shifter for shifting said signal samples in accordance with said predetermined frequency interval system so as to provide improved periodicity of a resulting output signal; and an output for outputting said output signal.

10. Apparatus as claimed in claim 9, wherein said sampler operates on a baseband portion of said RF modulated signal so as to reduce said distortion.

11. Apparatus as claimed in claim 9, wherein said frequency shifter operates on a baseband portion of said RF modulated signal so as to reduce said distortion.

12. Apparatus as claimed in claim 9, further comprising a phase estimator, disposed between said sampler and said frequency shifter, for estimating a phase of said input RF signal, said phase manipulator operating in accordance with an output of said phase estimator.

13. Apparatus as claimed in claim 12, further comprising a phase manipulator, disposed between said frequency shifter and said output, for manipulating a phase of said signal samples to provide a predetermined phase relationship.

14. Apparatus as claimed in claim 9, further comprising a periodicity estimator, disposed between said sampler and said frequency shifter, for estimating a periodicity of said input RF signal, said frequency shifter operating in accordance with an output of said periodicity estimator.

15. Apparatus as claimed in claim 9, wherein said predetermined frequency interval system is Tru-Scale.

16. Apparatus for reducing distortion in an RF modulated signal, comprising:

a frequency counter for estimating periodicity of an incoming signal, said incoming signal being composed of a plurality of frequencies, and providing a frequency counter estimate;

a phase estimator for estimating dominant phase properties of the input signal;

an analog-to-digital converter for converting the input signal into a digital signal having discrete steps, wherein said discrete steps are defined by a predetermined frequency interval system;

means, responsive to said the above frequency counter estimate, for shifting the digital signal to frequencies in accordance with said predetermined frequency interval system; and a phase manipulator, responsive to an output of said phase estimator, for shifting the phase to a predetermined phase relationship.

17. Apparatus as claimed in claim 16, wherein said predetermined frequency interval system is Tru-Scale.

* * * * *